US005853691A

United States Patent [19]
Doxsee

[11] Patent Number: 5,853,691
[45] Date of Patent: *Dec. 29, 1998

[54] SILVER HALIDES OF ALTERED CRYSTAL HABIT OR MORPHOLOGY AND METHODS FOR PRODUCING SAME

[75] Inventor: Kenneth M. Doxsee, Eugene, Oreg.

[73] Assignee: State of Oregon acting by and through the Oregon State Board of Higher Education on the behalf of the University of Oregon, Eugene, Oreg.

[*] Notice: The term of this patent shall not extend beyond the expiration date of Pat. No. 5,545,394.

[21] Appl. No.: 695,784

[22] Filed: Aug. 12, 1996

Related U.S. Application Data

[63] Continuation-in-part of Ser. No. 104,863, Aug. 10, 1993, Pat. No. 5,545,394.

[51] Int. Cl.[6] ............................... C01B 9/00; C01G 5/02
[52] U.S. Cl. .............................................. 423/491; 23/300
[58] Field of Search ........................ 423/491; 23/295 R, 23/300

[56] References Cited

U.S. PATENT DOCUMENTS

| | | | |
|---|---|---|---|
| 4,308,031 | 12/1981 | Au ........................................... | 423/179 |
| 4,347,230 | 8/1982 | Nicolau .................................. | 429/491 |
| 4,436,664 | 3/1984 | Gokel ................................... | 260/330.6 |
| 4,474,963 | 10/1984 | Gokel ..................................... | 549/352 |
| 4,687,844 | 8/1987 | Gokel et al. ............................ | 540/467 |
| 4,710,455 | 12/1987 | Iguchi et al. ............................ | 423/491 |
| 4,724,200 | 2/1988 | Maskasky ............................... | 423/491 |
| 5,213,772 | 5/1993 | Ichikawa et al. ....................... | 423/491 |
| 5,258,275 | 11/1993 | Arai et al. ............................... | 430/253 |
| 5,320,822 | 6/1994 | Ozin et al. .............................. | 423/659 |
| 5,443,943 | 8/1995 | Szajewski ............................... | 430/393 |
| 5,545,394 | 8/1996 | Doxsee ................................... | 423/659 |

OTHER PUBLICATIONS

Doxsee et al., "Complexation–Mediated Crystallization of Sodium Acetate Trihydrate Needles from Cyclohexane Solution,"*J. Inclusion Phenom.* 9:327–336 (1990).

Doxsee et al., "Unusual Coordination Number and Geometry in a Potassium 18–Crown–6 Complex,"*J. Am. Chem. Soc.* 114:5165–5171 (1992).

Bianconi et al., "Crystallization of an Inorganic Phase Controlled by a Polymer Matrix,"*Nature* 349:315–317 (1991).

Nicolau, "Solution Growth of Sparingly Soluble Single Crystals from Soluble Complexes—I. General Introduction, "*J. Crystal Growth* 48:45–50 (1980).

Nicolau, "Solution Growth of Sparingly Soluble Single Crystals from Soluble Complexes—II. Growth of $\alpha$–$HgI_2$ Single Crystals from Iodomercurate Complexes,"*J. Crystal Growth* 48 :51–60 (1980).

Nicolau et al., "Solution Growth of Sparingly Soluble Single Crystals from Soluble Complexes—III. Growth of $\alpha$–$HgI_2$ Single Crystals from Dimethylsulfoxide Complexes, "*J.Crystal Growth* 48 :61–73 (1980).

Boulin, et al., "Gel–Growth of Silver Acetate Crystals,"*J. Crystal Growth* 6 :290–292 (1970).

Armington, et al., "Recrystallization by Shifting the Equilibrium of Chemical Complexes—The Growth of Cinnabar, "*J. Crystal Growth* 6 :278–280 (1970).

*Primary Examiner*—Gary P. Straub
*Attorney, Agent, or Firm*—Klarquist Sparkman Campbell Leigh & Whinston, LLP

[57] ABSTRACT

Methods are disclosed in which first and second reactant salts and a complexing agent are added to a non-aqueous reaction solvent in which the complexing agent is soluble. The complexing agent is a crown ether or other cyclic or acyclic polydentate chelating agent that, in the reaction solvent, forms chelation complexes with at least one of the reactant salts. The reactant salts, which are substantially soluble and reactive with each other in water to form a first crystallite of silver halide, are present in the reaction solvent in relative amounts that are sufficient to form a desired amount of the silver halide in the reaction solvent. Reaction of the first and second reactant salts in the reaction solvent forms a second crystallite precipitate comprising crystals of silver halide having a different habit or morphology from silver halide crystals in the first crystallite that would otherwise be formable in water by reaction of similar amounts of the first and second reactant salts.

18 Claims, 6 Drawing Sheets

SILVER HALIDES OF ALTERED CRYSTAL HABIT OR MORPHOLOGY AND METHODS FOR PRODUCING SAME

CROSS REFERENCE TO RELATED APPLICATION

This application is a continuation-in-part of U.S. patent application Ser. No. 08/104,863, filed on Aug. 10, 1993, which issued as U.S. Pat. No. 5,545,394 on Aug. 13, 1996.

FIELD OF THE INVENTION

This invention pertains to new crystalline forms of silver halide compounds and methods for their preparation.

ACKNOWLEDGMENT

Research that resulted in this invention was supported by grant no. N-00014-91-J-1731 from the Office of Naval Research. The government has rights in this invention.

BACKGROUND OF THE INVENTION

Interest in crystallization, and in various ways for altering the shapes and structures of crystals, has a long history because an extraordinary range of physical and chemical properties of crystalline solid-state materials is dictated to a large extent by their crystal form and size. Efforts to modify crystallization processes so as to generate new crystalline forms of substances continue to be of considerable importance for various reasons including, for example, improvement of mass-handling characteristics of particulate materials, production of materials that are stronger or more durable than existing materials, and production of materials having improved physical characteristics such as light transmissivity.

Conventional ways of altering the shape (i.e., the "habit") or the crystal lattice (i.e., the "morphology") of a crystalline material include: (1) using additives (Weissbuch et al., *Science* 253:637, 1991; Addadi et al., *Topics in Stereochem.* 16:1, 1986; Addadi et al., *Angew. Chem. Int. Ed. Engl.* 24:466, 1985; and Addadi et al., *Nature* 296:21, 1982); and (2) changing the crystallization solvent (including crystallization from the gas phase) used to dissolve the crystallization solute. Unfortunately, these methods are not universally applicable and frequently do not produce the desired form of a compound.

U.S. Pat. No. 5,545,394 to Doxsee, incorporated herein by reference, is directed, inter alia, to methods for forming crystallite products by chemical reaction. A representative method involves a reaction between a first and a second reactant salt in an organic solvent in the presence of a complexing agent. The first reactant salt is substantially soluble in water but is poorly soluble to insoluble in the organic solvent. The second reactant salt is reactive with the first reactant salt in water to form a first crystallite of a product compound. The complexing agent is soluble in the organic solvent and can form chelation complexes with the first reactant salt so as to facilitate, for example, dissolution of the first reactant salt in the organic solvent. The reaction results in formation of a second crystallite, substantially insoluble in the organic solvent, comprising crystals of the product compound that have a different habit or morphology from crystals of the product compound in the first crystallite that otherwise would be formable in water by reaction of the first and second reactant salts without the complexing agent.

A notable method for producing large single crystals involves the diffusion of a reacting solution into an aqueous gel matrix containing a second reactant. Henisch, Crystals in Gels and Liesegang Rings, Cambridge University Press, 1988. The relatively slow diffusion afforded by a gel matrix favors crystal growth over nucleation, resulting in large and rather perfect crystals. This approach, however, has always been performed using aqueous solutions and gels, which are simply not suitable for many materials of interest, and which do not permit the use of solvent effects to alter crystal habit and/or morphology.

Many salts that are substantially soluble in water are poorly soluble to insoluble in many organic solvents. Solvent effects on the alteration of crystal growth of such salts have not been explored to any great extent simply because one must dissolve the salt before it can be crystallized from solution.

The silver halides (especially AgCl, AgBr, and AgI) are best known for their central importance in the photographic process. Also, as indirect-gap (AgCl, AgBr) or direct-gap (AgI) semiconductor materials, silver halides display a number of other interesting properties in addition to their photoreactivity. Marchetti et al., in Volman et al. (ed.), *Advances in Photochemistry* 17:145, Wiley, N.Y., 1992. Each of these properties could be modified through control of silver halide particle size, habit, morphology, and/or composition. The need to fine-tune properties of silver halides, particularly in the photographic arena, has led to a large number of both experimental (Chong, *J. Imaging Sci. Tech.* 39:120, 1995; Mitchell, *J. Imaging Sci. Tech.* 39:331, 1993) and theoretical (Muhr et al., *Chem. Eng. Sci.* 51:309, 1996; Muhr et al., *Chem. Eng. Sci.* 50:345, 1995) studies of silver halide morphology alteration.

Silver bromide or silver bromide/iodide is generally obtained in cubic (bounded by {100} faces), octahedral (bounded by {111} faces), or cuboctahedral (displaying both {100} and {111} faces). The latter form, particularly in the form of flattened pseudohexagonal tablets, displays particularly desirable properties in photographic films. Maskasky, *J. Imaging Sci. Tech.* 40:79, 1996; Mehta et al., *J. Imaging Sci. Tech.* 40:77, 1996; Mehta et al., *J. Imaging Sci. Tech.* 39:67, 1995; Antoniades et al., *J. Imaging Sci. Tech.* 39:323, 1995; Mehta et al., *J. Imaging Sci. Tech.* 37:107, 1993; and Maskasky, *J. Imaging Sci. Tech.* 31:15, 1987. Despite rapid developments in digital imaging, it appears that more traditional silver halide-based photographic imaging will remain a critical process for some time to come, Biehn, *PSA Journal* 60:24, 1994, and continued development of new techniques for the controlled modification of silver halide morphology remains essential.

Silver halides are conventionally prepared through reaction-crystallization from aqueous solutions of precursor salts (e.g., $AgNO_3$ and NaBr). On a research scale, crystallization techniques in aqueous gels have been examined (Zlank et al., *Nature* 216:1103, 1967, in which AgBr cubes were formed; Halberstadt, *Nature,* 216:574, 1967, in which AgI hexagonal platelets were formed; Roy, *Kolloid Z.* 54:190, 1931, in which AgI Liesegang rings were formed; and Chatterji et al., *J. Ind. Chem. Soc.* 28:128, 1951, in which AgCl and AgI Liesegang rings were formed). However, compared to the great attention devoted to the crystallization of certain materials (e.g., $CaCO_3$, PbS) by this method (Hatschek, *Kolloid Z.* 8:193, 1911; Fisher et al., *Amer. Mineralogist* 11:124, 1926; Nickl et al., *J. Electrochem. Soc.* 116:1258, 1969; Brenner et al., *Nature* 212:392, 1966; Blank et al., *Mat. Res. Bull.* 3:555, 1968; Blank et al., *J. Cryst. Growth* 11:258, 1971; Sangwal et al., *J. Cryst. Growth* 23:282, 1974; and Garcia-Ruiz, *J. Cryst. Growth* 75:441, 1986), the silver halides have been only cursorily examined.

Therefore, there is a need for methods for producing, via reaction-crystallization, any of various silver halide compounds comprising crystals that are different in habit and/or morphology from crystals of these compounds produced by crystallization or recrystallization from aqueous solution. There is also a need for silver halide crystals and crystallites having altered habit and/or morphology.

SUMMARY OF THE INVENTION

The foregoing needs are met by the present invention which provides, inter alia, methods and reaction systems for forming silver halide crystallites having altered habit and/or morphology. Also provided are silver halide crystallites formed by such methods.

In a general method according to the invention, first and second reactant salts and a complexing agent are added to a non-aqueous reaction solvent to form a reaction system. The complexing agent is soluble in the reaction solvent and is selected from a group consisting of crown ethers and other cyclic and acyclic polydentate chelating agents. The first and second reactant salts are substantially soluble in water and are reactive with each other in water to form a first crystallite of silver halide. In the reaction system, the complexing agent forms chelation complexes with at least one of the reactant salts. The first and second reactant salts are present in the reaction solvent in relative amounts that are sufficient for reaction of the first and second reactant salts with each other in the reaction system to form a desired amount of the silver halide. The reaction in the reaction system results in formation of a second crystallite precipitate that comprises crystals of silver halide that have a different habit or morphology from silver halide crystals in the first crystallite that would otherwise be formable in water by reaction of similar amounts of the first and second reactant salts in water.

The foregoing and other features and advantages of the present invention readily can be ascertained from the following description and accompanying drawings.

DETAILED DESCRIPTION

Figure 1:
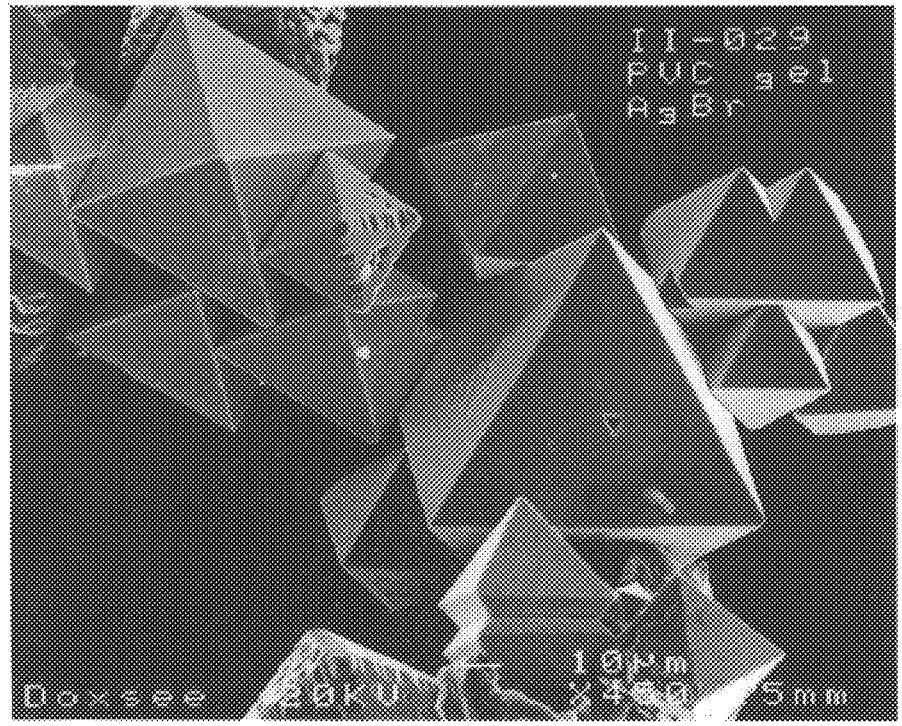
FIG. 1 is a photograph showing crystals of AgBr according to the present invention formed in a U-tube reaction system, as described in Examples 2–5, involving interdiffusion of a solution of a first reactant salt ($AgNO_3$ in DMSO) and a solution of a second reactant salt (NaBr in DMSO) into a 9% PVC gel including DMSO, wherein at least one of the solutions included the complexing agent 18-crown-6. The scale bar length is 10 $\mu$m.

"Complexation-mediated crystallization" is discussed in Doxsee et al., *J. Inclus. Phenom. & Molec. Recog. in Chem.* 9:327-336, 1990, incorporated herein by reference. In such methods, a complexing agent (e.g., a crown ether that is soluble in a non-aqueous solvent) is used to facilitate dissolution of a salt, freely soluble in water, in the non-aqueous solvent, wherein the salt is subsequently crystallized from the non-aqueous solvent. During the dissolution step, molecules of the complexing agent form chelation complexes with one or more of the constituent ions of the salt, thereby enabling the salt to "dissolve" (while still complexed with the crown ether) in the non-aqueous solvent. Subsequent evaporation of the solvent results in crystallization of the salt. With respect to an example involving sodium acetate, rather than a typical hexagonal plate habit characteristic of sodium acetate trihydrate crystals formed from aqueous solution, the crystals formed in the non-aqueous solvent have a needle shape but have the same lattice parameters as hexagonal plate crystals of sodium acetate. The non-aqueous solvent apparently exerts a pronounced salvation effect on the relatively non-polar lateral crystal faces (on which van der Waals contacts between methyl groups of the acetates apparently predominate) but comparatively little solvation effect on the relatively polar axial faces (built up of alternating layers of $Na^+$ ions, water molecules, and acetate carboxylates). Thus, the axial faces are caused to grow more rapidly than the lateral faces.

The present invention provides a way to produce crystalline silver halide products (i.e., "crystallites" of silver halides) by chemical reaction, not merely by crystallization or recrystallization from a solution. In a reaction according to the present invention, product silver halide crystals are formed that have an altered crystal shape (crystal habit) and/or crystal lattice structure (crystal morphology) compared to product silver halide crystals formed by conventional methods.

A "reaction system" for forming silver halides according to the present invention comprises: (1) reactant salts capable of forming a silver halide product by chemical reaction, and (2) a non-aqueous solvent (termed herein the "reaction solvent") in which one or more of the reactant salts are to be dissolved (but in which one or more of the reactant salts may not be freely soluble). Especially if at least one of the reactant salts is poorly soluble to insoluble in the reaction solvent, a "complexing agent" suitable for effecting dissolution of the reactant salt(s) in the non-aqueous solvent can be included in the reaction system. (Even if the reactant salts are adequately soluble in the reaction solvent, a complexing agent can be included in the reaction system to effect a change in crystal habit or morphology relative to a reaction involving the same reactant salts in the reaction solvent without a complexing agent and/or relative to a control reaction involving the same reactant salts but performed in an aqueous solvent.) The reactant salts, reaction solvent, and complexing agent are discussed in further detail below.

A chemical reaction according to the present invention involves molecules and/or ions of at least two reactant salts that are presented to each other for reaction while in a dissolved condition. Interaction of the reactant salts can occur by interdiffusion which can occur in a completely liquid medium or in a supported medium such as a gel.

Whenever dissolution of a reactant salt in the reaction solvent is facilitated by use of a complexing agent, it is not necessary that all the reactant salt be dissolved before the onset of reaction. The complexing agent is typically not consumed during the reaction and can therefore serve as a "dissolution catalyst" for the corresponding reactant salt. As molecules or ions of the reactant salt dissociate from molecules of the complexing agent and become incorporated into the silver halide product, the liberated molecules of the complexing agent become free to facilitate dissolution of more of the remaining unreacted reactant salt. Thus, the complexing agent can be present in "catalytic" (i.e., substoichiometric) amounts in the reaction system.

As the reaction progresses, the silver halide product forms as one or more crystalline masses (crystallites) that precipitate and are thus readily separable from the reaction solvent using conventional separation techniques. The crystallite can be comprised of visually discernable crystals or of crystals that are so small that the crystallite appears to be amorphous.

A key factor in determining whether or not a reactant salt will dissolve in a particular reaction solvent is the polarity of the molecules or ions of the reactant salt relative to molecules of the reaction solvent. In general, reactant salts having polar moieties have a higher solubility in polar solvents compared to reactant salts having mostly substantially non-polar moieties. Thus, at a given temperature, a greater amount of a polar reactant salt will dissolve in a polar solvent than in a relatively less polar solvent. If used to increase solubility of a reactant salt in the reaction solvent, the complexing agent, by bonding to the reactant salt, alters the polarity of the reactant salt, usually by making the molecules (or constituent ions) of the reactant salt less polar.

Most reactant salts usable for producing silver halides are normally soluble in water and have either limited solubility or substantial insolubility in less polar solvents.

As used herein, a "non-aqueous reaction solvent" is a solvent other than substantially pure water. In order to sufficiently dissolve a reactant salt in such a solvent for the desired reaction to occur between reactant salts, a complexing agent can be used that is soluble in the non-aqueous reaction solvent and that can form a complex with the reactant salt to be dissolved in the non-aqueous reaction solvent.

It is possible for a first reactant salt to be soluble in the reaction solvent and a second reactant salt to have limited solubility in the reaction solvent. In such an instance, a complexing agent can be used to facilitate dissolution of the second reactant salt in the reaction solvent.

It is also possible for both reactant salts to be soluble in the reaction solvent. In such an instance, the complexing agent can be used to alter the habit and/or morphology of the crystallite product.

Reaction systems according to the present invention also encompass systems in which both the first and second reactant salts require complexing agents for dissolution. The complexing agents can be the same or different. In a representative example of such a system, a first solution containing a first complexed reactant salt is layered atop a second solution containing a second complexed reactant salt, wherein the reaction occurs at the interface of the first and second solutions. Additional "phases" are also possible.

It is not necessary that the reaction system comprise a phase interface at all. "Single-phase" reactions in a single reaction solvent comprising all the reactant salts are within the scope of the present invention.

The complexing agent performs at least one of the following roles: (a) solubilizing a reactant salt in the reaction solvent; and (b) influencing the habit and/or morphology of the crystalline silver halide product formed in the reaction solvent, presumably by affecting the differential rates of growth on certain crystal faces relative to other crystal faces. In reaction systems in which both reactant salts, in the absence of the complexing agent, are insoluble in the reaction solvent, the complexing agent generally performs both roles. In reaction systems in which one reactant salt is insoluble in the reaction solvent and requires complexation with the complexing agent in order to be dissolved in the reaction solvent, but the other reactant salt is soluble in the reaction solvent, the complexing agent again performs both roles. In reaction systems in which both reactant salts are sufficiently soluble in the reaction solvent for the reaction to occur, the complexing agent serves mainly the second role.

A molecule of the complexing agent can facilitate dissolution of a molecule or ion of a reactant salt by forming a chelation complex with the molecule or ion. Due to, inter alia, the solubility of the complexing agent in the reaction solvent, the resulting complex is also soluble in the reaction solvent. Such complex formation can be exemplified by envisioning formation of a chelate, as known in the art, comprising a molecule of the complexing agent (serving as a chelating agent) interacting with a molecule or ion of the reactant salt in a non-covalent way (i.e., by dative bonding) so as to form a coordination compound. In such a coordination compound, a molecule or ion of the reactant salt is attached by multiple coordination links to two or more usually non-metal atoms in the complexing-agent molecule. Complexing agents offering two groups for attachment to the ion are termed "bidentate;" complexing agents offering three groups are termed "tridentate," and so on. The chemical groups on the complexing agent that participate in bonding of the reactant salt are typically electron-donors. Complexing agents are also termed "ligands" in the art.

As can be surmised from the foregoing, since molecules of complexing agents typically have bonding groups that are electron donors, the regions of the corresponding molecules or ions from the reactant salt that become bonded to such complexing agents are electron acceptors. For example, reactant-salt ions typically are cationic, and can be actual polyatomic or monoatomic cations. It is also possible for molecules or ions of the reactant salt(s) to interact with the complexing agent by other bonding mechanisms such as hydrogen bonding.

The complexing agent can also interact with a reactant salt in other ways to facilitate dissolution of the reactant salt. For example, a complexing agent may interact with non-polar regions of ions or molecules of reactant salts by, for example, "hydrophobic" bonds.

The bonding of an ion or molecule of the reactant salt to the complexing agent must not be so strong that, during the crystallite-forming reaction, the ion or molecule cannot dissociate from the complexing agent. Release of the reactant-salt ion or molecule from the complexing-agent molecule to form the silver halide product must be energetically favorable.

Especially preferred complexing agents are any of various crown ethers (i.e., any of various cyclic polyethers in which the ether groups are connected by methylene or silicon linkages and the ether oxygen atoms serve as electron donors). Representative crown ethers include, but are not limited to, 12-crown-4, 15-crown-5, 18-crown-6, dicyclohexyl-18-crown-6, and dibenzo-18-crown-6. Each crown ether binds a particular range of cations, depending upon the size of the central cavity of the crown ether molecule. Other possible complexing agents are discussed in U.S. Pat. No. 5,545,394, incorporated herein by reference. Other cyclic and acyclic polydentate complexing agents can be used, including, but not limited to, crown ether analogs containing other donor atoms in addition to or in place of oxygen atoms, such as 1,4,7,10-tetraazacyclododecane ("cyclen"), 1,4,8,11-tetraazacyclotetradecane ("cyclam"), and 1,4,7,10,13,16-hexathiacyclooctadecane; and acyclic chelating agents such as tris[2-(2-methoxyethoxy)ethyl] amine, poly(ethylene glycols), and glymes.

The maximal amount of complexing agent to employ in a desired reaction system would be, for economic reasons, no greater than a stoichiometric amount relative to the amount of the corresponding reactant salt. Of course, if the complexing agent works "catalytically," substantially less than a stoichiometric amount would be required.

In any event, a person of ordinary skill in the relevant art would be familiar with various complexing agents and how to go about selecting an appropriate complexing agent for a particular reactant salt and reaction solvent. Many candidate complexing agents are commercially available and can be tested for efficacy in a given reaction by a simple test-tube experiment. I.e., bench-top experiments to test the efficacy of a particular complexing agent are within the skill of persons of ordinary skill in the relevant art.

It is also comprehended that many complexing agents, such as (but not limited to) crown ethers, can be made more soluble in certain hydrophobic solvents by chemically attaching lipophilic moieties to molecules of the agents.

As stated above, reactant salts for forming silver halides according to the present invention are normally soluble in water. Reaction solvents for use in reaction systems according to the present invention include any of various solvents that are less polar than water, particularly relatively non-polar organic solvents. Such reaction solvents include hydrophobic solvents and solvents that have some degree of hydrophilicity (normally less than water), and can comprise mixtures of pure solvents including mixtures with water.

Representative reaction solvents, not intended to be limiting in any way, include polar aprotic solvents such as dimethylsulfoxide (DMSO) and dimethylformamide (DMF); ethereal solvents such as tetrahydrofuran (THF) and diethyl ether; alkanes, olefins, alkyl halides, alcohols, and ketones of up to 20 carbons; and aromatic, heteroaromatic, and aryl halide solvents of up to 20 carbons such as toluene, nitrobenzene, pyridine, and quinoline. These specific solvents, representing various classes and types of organic solvents, indicate that any of a wide variety of organic solvents can be utilized, and that useful reaction solvents are not limited to a particular class of solvents.

Since the reaction solvent is preferably a liquid under reaction conditions, this places a limit on the number of carbons, for example, molecules of the reaction solvent can have. Solvent compounds having a greater number of carbon atoms (greater than about 20) tend either not to be liquids or to be too viscous under reaction conditions to be of practical utility.

Choosing a reaction solvent can be somewhat empirical. Basically, if a reactant salt cannot be made to dissolve in the reaction solvent, even after attempting to facilitate dissolution using any of various complexing agents, a different reaction solvent should be selected. Sometimes, difficulties with a reaction solvent can be solved by simply using a different complexing agent. If dissolution of the reactant salt is too slow, agitation can be helpful, including use of an ultrasonicator.

The reaction system can include a gel support. Representative gels that are relatively polar include, but are not limited to, poly(vinylacetate) (PVAc) and poly(vinylalcohol) (PVA). In the usual instance where the reaction solvent is non-polar, any of various non-polar gels can be used, including any of various solvent-swollen organic polymer gels such as, but not limited to, poly(ethylene) gel, poly (styrene) gel, and poly(vinylchloride) (PVC) gel. For example, dissolution of 7–9% (w/w) of poly(vinylchloride) in DMSO at elevated temperature (ca. 80° C.), followed by cooling to room temperature, affords a suitable solvent-swollen polymer gel. A comparable gel is obtained with ca. 18% (w/w) of poly(vinylchloride) in DMF. A gel can facilitate the formation of large crystals. Also, use of a gel can have particular utility in two-phase reactions (i.e., reactions involving one solution layered atop another wherein the reaction occurs at the layer interface) according to the present invention, wherein the gel can serve to slow the rate of reaction and can simplify setting up the phases prior to onset of the reaction.

The specific gelling agent to be used may be chosen on the basis of its ability to form a gel in the desired reaction solvent. The gelling agent may also be chosen in order to exploit its specific chemical properties (e.g., the ability to complex with ionic species or to interact with growing crystallites.)

Inducing formation of the silver halide product in a reaction system according to the present invention can be, and usually is, spontaneous. However, crystallization can be triggered by introducing a seed crystal or other nucleation aid to the system. Other methods of inducing crystal formation include thermal shock, physical shock, and methods that achieve at least localized supersaturation. "Double-jet precipitation" has also been used successfully, wherein first and second solutions of reactant salts are added simultaneously to a stirred crystallizer.

The products of reactions according to the present invention comprise crystals (i.e., the products are "crystallites") of silver halide. The crystallites can comprise an assemblage of individual silver halide crystals that are microscopic in size. Generally, the faster the reaction, the smaller the crystals of the product.

The silver halide crystallite products are not necessarily comprised of crystals larger than products of corresponding reactions performed according to the prior art. Rather, silver halide crystallites formed according to the present invention comprise crystals that exhibit an altered habit and/or morphology. In the case of reactions according to the present invention forming silver halide products consisting of smaller crystals, such crystallites can have unusual physical properties compared to crystallites consisting of larger crystals.

The product crystallite can comprise more than one silver halide compound. The crystallite can be a "mixed" silver halide such as AgBr/AgI. Mixed crystallites of silver halide are of particular interest in the photographic industry.

Preferred reactant salts capable of forming silver halide products according to the present invention include, but are not limited to, the following:

Representative Silver Sources

Silver tetrafluoroborate ($AgBF_4$)

Silver nitrate ($AgNO_3$)

Silver salts of monobasic acids: $RCO_2Ag$, wherein $RCO_2$ =acetate, propanoate, butyrate, valerate, lactate, benzoate, salicylate, cinnamate, laurate, linoleate, oleate, palmitate, stearate, etc.

Silver chlorate ($AgClO_3$)

Silver bromate ($AgBrO_3$)

Silver iodate ($AgIO_3$)

Silver cyanate (AgOCN)

Silver sulfate ($Ag_2SO_4$)

Representative Halide Sources

MX (M=Li, Na, K, Rb, Cs, $NH_4$; X=F, Cl, Br, I)

$MX_2$ (M=Mg, Ca, Sr, Ba; X=F, Cl, Br, I)

Any reactant salt can be either anhydrous or any of the various hydrates thereof.

The present invention can have utility in any application in which an altered crystal habit and/or morphology of silver halide is a benefit. Whereas such altered silver halides have particular utility in the photographic industry, other uses for such products are certainly comprehended. With respect to photography, silver halide is a key ingredient in photographic emulsions. Alterations in crystal shape of these compounds would likely be instrumental in improving the resolution, for example, of photographic films. Other possible uses for silver halides made according to the present invention are summarized in U.S. Pat. No. 5,545,394, incorporated herein by reference.

The following examples are provided:

EXAMPLE 1

In this example, interdiffusion and reaction of dimethylsulfoxide (DMSO) solutions of silver nitrate and sodium bromide in a gel were evaluated. The gel was a 9% (w/w) poly(vinylchloride) (PVC) in DMSO formed in a U-tube. Since this Example served as a control for subsequent Examples, no complexing agent was used.

To prepare the gel, 1.35 g of PVC (Aldrich Chemical Co., "high molecular weight", inherent viscosity 1.02, relative viscosity 2.40) was dissolved in 13.6 g of DMSO at 80° C. The resulting solution was poured into a ca. 1-cm diameter U-tube and allowed to cool to room temperature. A solution of 0.0169 g of $AgNO_3$ (0.100 mmol) in 10 mL of DMSO was placed in one side-arm of the U-tube and a solution of 0.0103 g of NaBr (0.100 mmol) in 10 mL of DMSO was placed in the other side-arm. The side-arms were stoppered and the entire apparatus was wrapped in aluminum foil to exclude light. The crystal-forming reaction was performed by incubating the U-tube at room temperature (ca. 23° C.) for 30 days. After production of AgBr product crystals was complete, the remaining supernatant solutions were removed by pipette and the gel was dissolved in 75 mL of tetrahydrofuran (THF). The AgBr was isolated by filtration on Nylon filter paper and washed sequentially with THF, acetone, water, THF, water, and acetone.

All preparations and reactions were carried out multiple times to assay reproducibility, and all batches of product crystals were analyzed by X-ray powder diffraction, scanning electron microscopy, and energy-dispersive X-ray (EDX) analysis.

This Example produced single AgBr crystals within the gel that grew slowly to a comparatively large size (ca. 30–50 µm edge length). In marked contrast to the cubic crystals of AgBr obtained from crystallization in aqueous silica gel (Blank et al., Nature 216:1103, 1967), a strong preference for octahedral crystal habit was observed. X-ray powder diffraction analysis revealed a close match with the well-known stable phase of silver bromide (Keim (ed.), Gmelins Handbuch der Anorganischen Chemie 61, part B, § 2, p. 12, Verlag Chemie, Wannheim, 1972), although EDX analysis during scanning electron microscope evaluation generally displayed the presence of traces of chloride, presumably arising from low levels of ion exchange with the PVC.

This Example is a demonstration of the effect of a non-aqueous solvent on forming a crystallite comprising crystals of altered habit or morphology compared to crystals formed in aqueous solution by the same reaction. This Example also serves as a control for Examples 2–5.

EXAMPLES 2–5

Examples 2–4 were performed as in Example 1 except that the chelating agent 1,4,7,10,13,16-hexaoxacyclooctahexadecane (18-crown-6) was added in equimolar amounts to either (Examples 2–3) or both (Example 4) reactant solutions. The results (FIG. 1) indicated that crystal perfection (i.e., the crystals had high-quality well-defined facets with few visible defects) was quite high under these growth conditions. In Example 5, use of an 18% (w/w) gel of poly(vinylacetate) in DMSO, rather than the PVC used in Examples 1–4, also yielded analogous crystalline silver bromide, again as octahedra, with edge lengths of about 80–90 µm.

Therefore, including a complexing agent in the reaction system yielded crystals having altered habit or morphology. Specifically, the crystals were larger octahedra with fewer defects.

EXAMPLES 6–7

These Examples were an evaluation of an alternative gel-growth procedure in which a solution of one reactant salt diffuses into a polymer gel containing the second reactant salt. These Examples served as controls (lacking any complexing agent in the reaction system) for Examples 8–9 (which included a complexing agent).

To prepare a 9% PVC gel for Example 6, 1.8 g of PVC (Aldrich Chemical Co., "high molecular weight", inherent viscosity 1.02, relative viscosity 2.40) was dissolved in a solution of 0.0207 g of NaBr in 20.0 g of DMSO at 80° C. (To make a 7% gel for Example 7, 1.4 g of PVC was dissolved in a solution of 0.0207 g of NaBr in 20.0 g of DMSO at 80° C.) Approximately 10 mL of the liquid gel solution was poured into a ca. 1-cm diameter glass test tube, the tube was sealed with Parafilm, and the solution was allowed to cool to room temperature. A solution of 0.0170 g of $AgNO_3$ in 10 mL of DMSO was added to the tube, which was capped and wrapped in aluminum foil to exclude light. The tube was then incubated at room temperature for 7–14 days. AgBr crystals formed in each tube were separately collected and analyzed as described in Example 1.

Figure 2A:
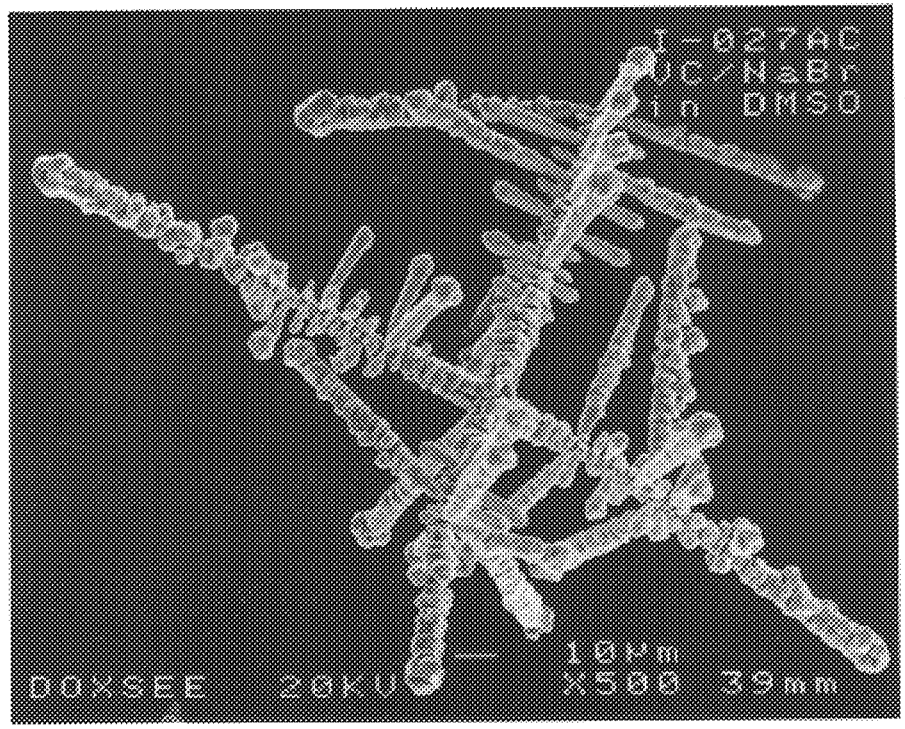
FIG. 2A is a photograph of AgBr crystals formed in a two-phase reaction system as described in Example 6, involving interdiffusion of a solution of a first reactant salt into a gel (9% PVC in DMSO) comprising a solution of a second reactant solution. The scale bar length is 10 $\mu$m.
Figure 2B:
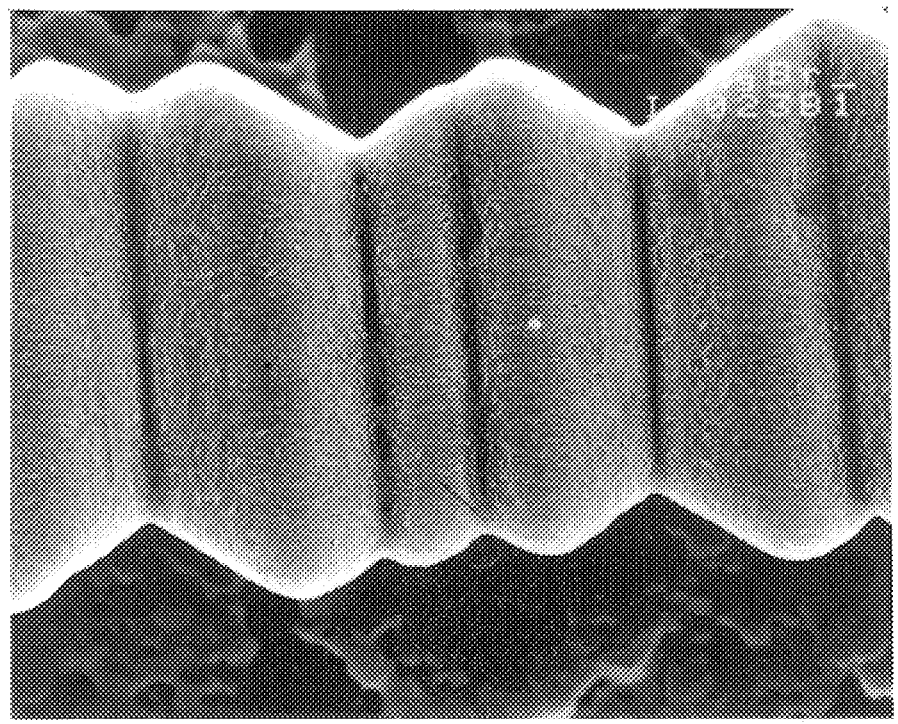
FIG. 2B is a closeup photograph of a crystal as shown in FIG. 2A.

In this two-phase reaction system, crystal growth was appreciably more rapid compared to the interdiffusion reaction system described in the previous Examples. Also, in this two-phase reaction system, macroscopic AgBr crystals appeared within several days (as opposed to several weeks in the interdiffusion reaction system). In Example 6, wherein the gel concentration was 9% (w/w), the silver bromide was produced as oriented octahedral intergrowths (FIGS. 2A–2B). This crystal morphology was qualitatively the same regardless of which reactant salt was incorporated into the gel. Clear directionality is observed in the crystallization, with initial one-dimensional growth being perpendicular to the gel/solvent interface. Dendritic branching was observed at longer diffusion times and greater distances from the interface.

Figure 3:
FIG. 3 is a photograph of AgBr crystals formed in a reaction system as described in Example 7, which was similar to Example 6 except that the gel was 7% PVC in DMSO. The scale bar is 10 $\mu$m.

In Example 7, wherein the gel was 7% PVC, a more highly dendritic morphology was observed (FIG. 3).

EXAMPLES 8–9

These Examples were similar to Examples 6–7, except that 18-crown-6, as a complexing agent, was added to the two-phase (gel/liquid) reaction system. To prepare the 7% PVC gel of Example 8, 1.4 g PVC was dissolved in a solution of 0.0207 g NaBr and 0.0264 g 18-crown-6 in 20.0 g of DMSO at 80° C. The 9% gel used in Example 9 was prepared similarly except that the mass of PVC was 1.8 g.

Figure 4:
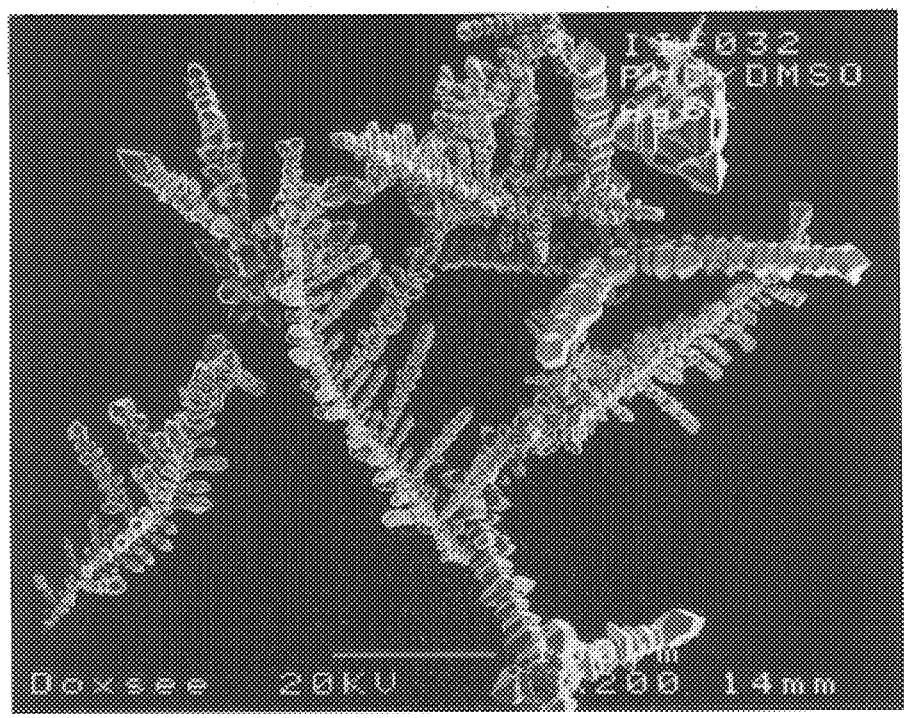
FIG. 4 is a photograph of AgBr crystals formed in a reaction system as described in Example 8, which was similar to Example 6, except that the reaction system included the complexing agent 18-crown-6. The scale bar is 10 $\mu$m.

The complexing agent exhibited a substantial impact on silver bromide crystal production; nucleation was substantially reduced, resulting in each crystal that formed undergoing more individual growth rather than large-scale ongoing nucleation. Thus, crystallinity was appreciably enhanced, as shown by the development of well-faceted crystalline undergrowths in Example 8 (FIG. 4; compare with FIG. 3 which shows the less-defined crystal morphology obtained without the complexing agent).

Figure 5A:
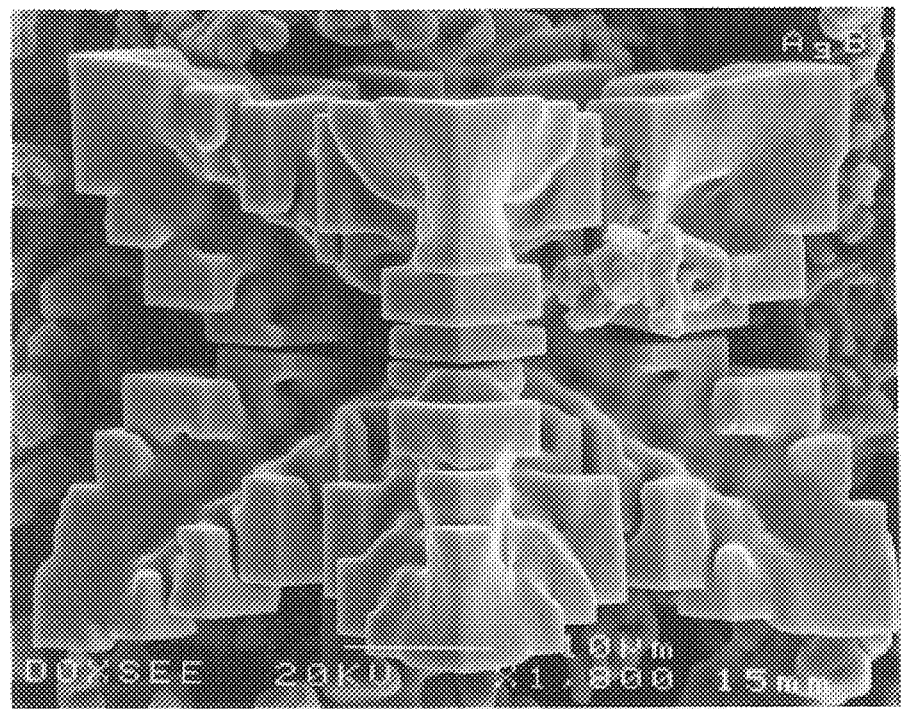
FIGS. 5A–5C are photographs of AgBr crystals formed in a reaction system as described in Example 9, which was similar to Example 7, except that the reaction system included the complexing agent 18-crown-6. The scale bar is 10 $\mu$m, and the amorphous material is residual PVC.
Figure 5B:
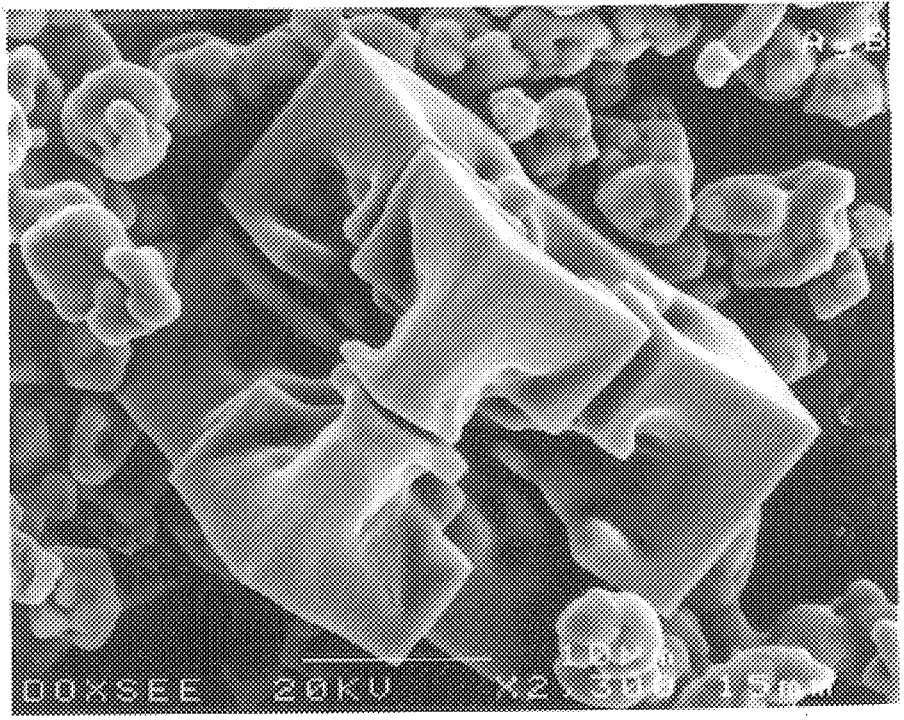
Figure 5C:
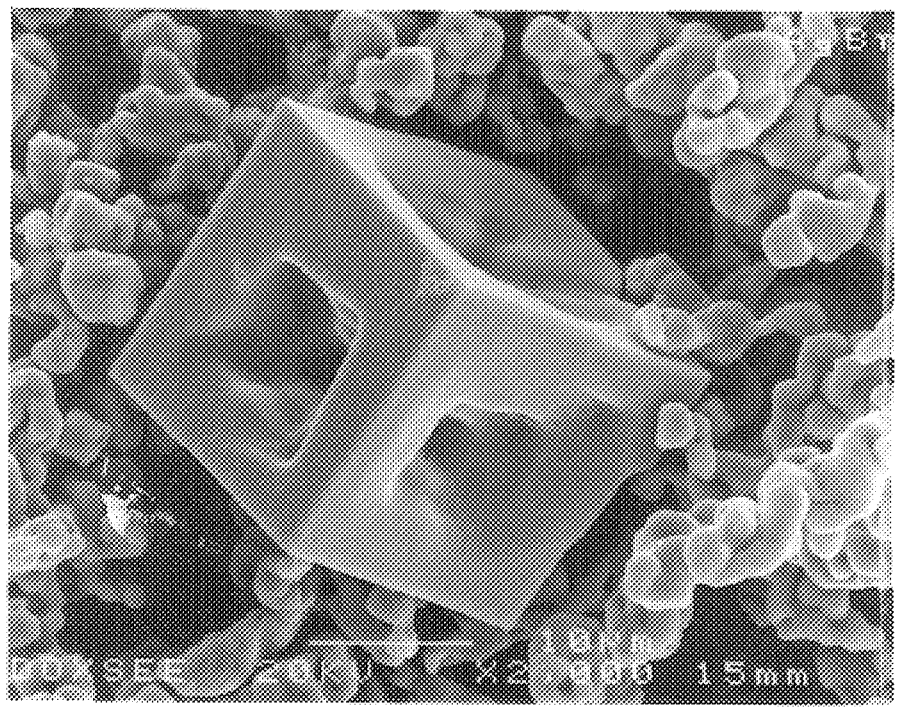

In the 9-% gel of Example 9, both further crystal growth and the generation of cube-based crystal habits was observed (FIGS. 5A–5C). Thus, it appears that, with nucleation diminished, initially "skeletal" crystalline intergrowths may evolve, through addition of incoming ions to high-energy lattice sites (Hartman, in Sunagawa (ed.), *Morphology of Crystals*, Terra Scientific Publishing, Tokyo, Part A, p. 269, 1987), to more complete crystalline structures.

In related experiments involving different initial salt concentrations and/or use of KBr instead of NaBr as a reactant salt, development of more unusual crystal morphologies, including {100} bounded morphologies, were observed.

EXAMPLE 10

The habit and/or morphology of silver halide crystals formed in certain reaction systems may be a result of whether or not the reactants are present in saturation or supersaturation conditions in the reaction system. To test this, Example 10 involved a reaction system similar to Example 7 in which one of the reactant salts was a solid in contact with a gel containing the second reactant salt. This arrangement produced high local concentrations of the reactant salts, even supersaturation levels, resulting in comparatively rapid and massive nucleation, and yielded a nearly amorphous AgBr product.

EXAMPLE 11

This Example is similar to Example 6, except that an 18% poly(vinylacetate) (PVAc) gel was used. (In this Example, the PVAc functioned not only as a gel support but also as a complexing agent.) The reaction produced only single octahedral crystals of AgBr. No oriented intergrowths were observed. This may have been due to supersaturation conditions, with the more polar (and potentially coordinating) PVAc gel supporting higher ion concentrations than PVC gel.

EXAMPLE 12

Figure 6:
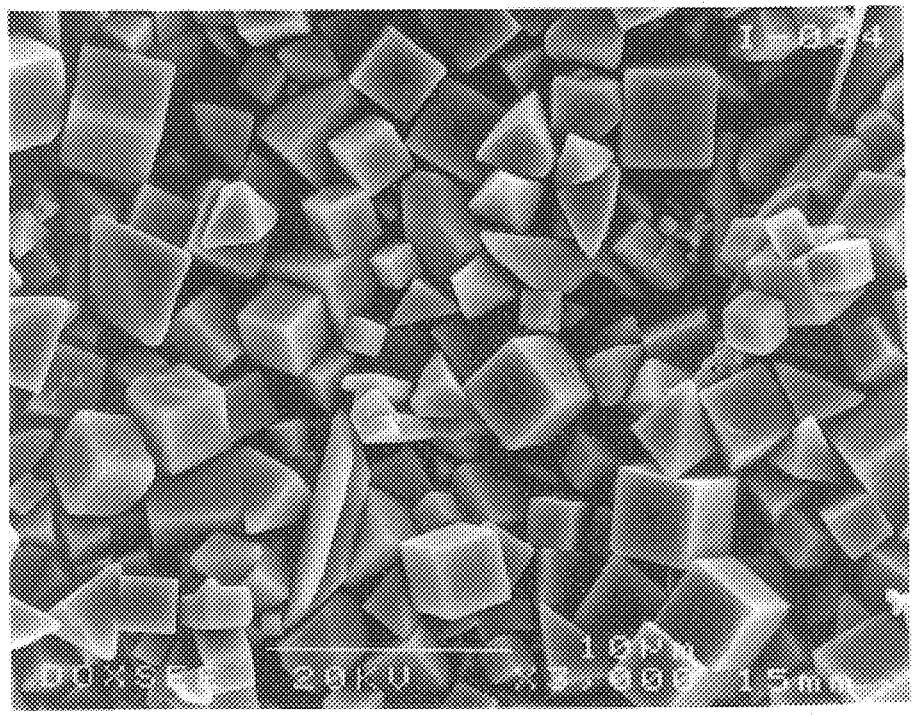
FIG. 6 is a photograph of AgBr crystals formed in a reaction system as described in Example 12, wherein the reaction solvent was DMF and the gel was 18% PVC. The scale bar is 10 $\mu$m.
Figure 7:
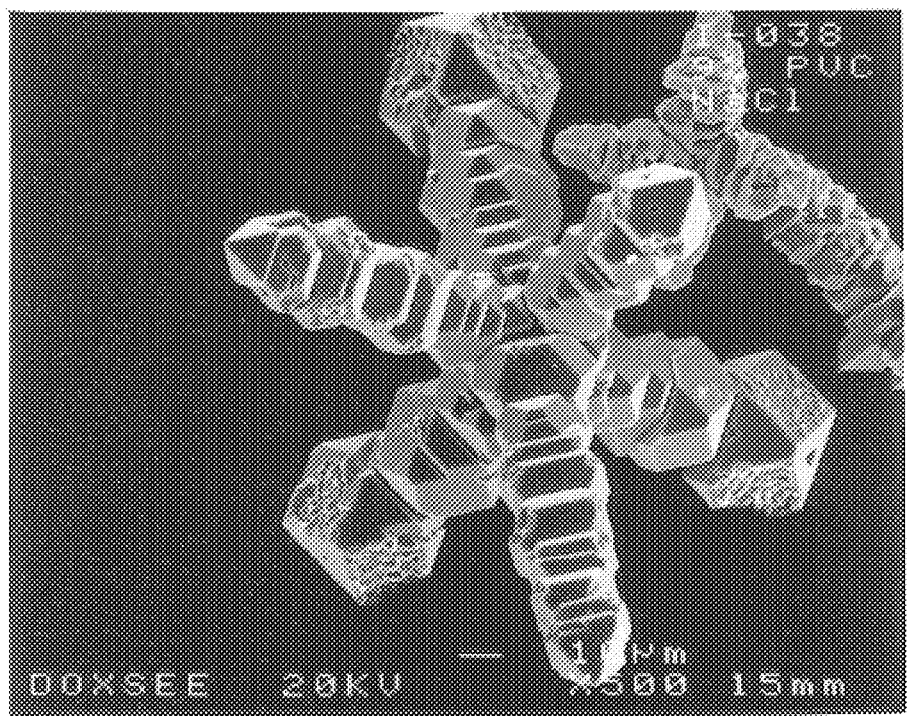
FIG. 7 is a photograph of AgCl crystals formed in a U-tube reaction system as described in Example 13, which was similar to Examples 2–5 except that the second reactant salt was NaCl. The scale bar is 10 $\mu$m.
Figure 8:
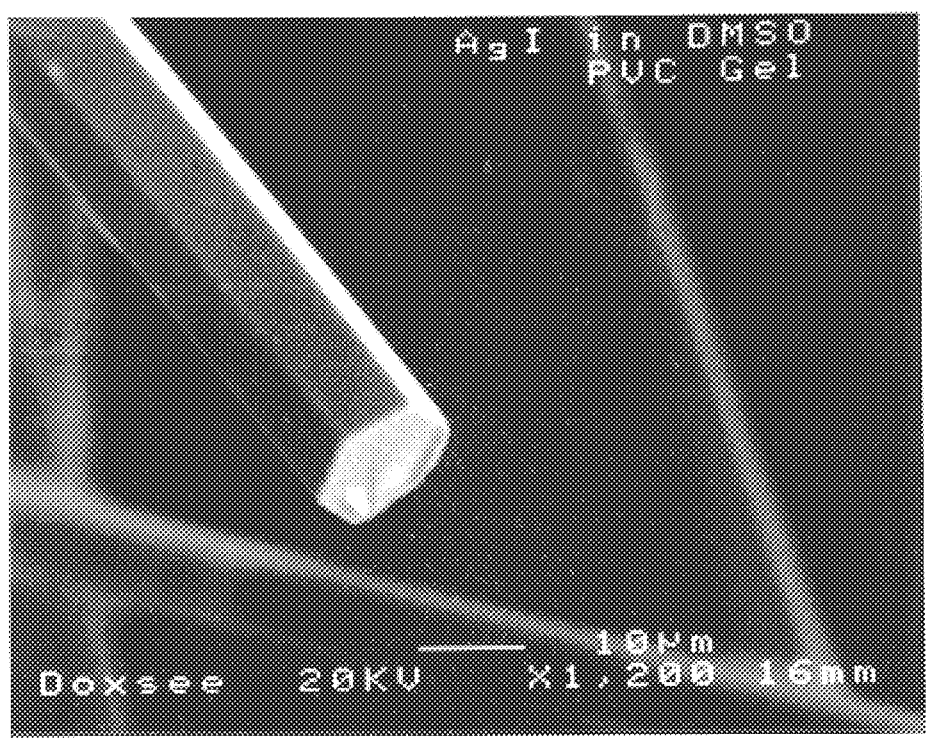
FIG. 8 is a photograph of AgI crystals formed in a two-phase reaction system as described in Example 14, which was similar to Examples 6–7 except that the second reactant salt was NaI. The scale bar is 10 $\mu$m.

In this Example, variations in crystal habit and morphology were observed when N,N-dimethylformamide (DMF) was used in place of DMSO as a reaction solvent. In DMF only single crystals (rather than oriented intergrowth of crystals) were formed even in the two-phase (gel/liquid) system. In DMF with an 18-% PVC gel, crystal morphology was apparently based upon cubic habit (together with significantly smaller quantities of crystals of apparently tetrahedral habit) rather than the octahedral habits favored in DMSO (FIG. 6). This dramatic change in crystal habit, effected by a simple solvent change, is perhaps most simply explained on the basis of selective interaction of the (coordinating) solvents with surface ions.

EXAMPLES 13–18

In these examples, reaction of $AgNO_3$ and NaBr to form AgBr by liquid—liquid interdiffusion of the respective reactant salt-containing solutions was examined. Both reactant solutions contained a complexing agent.

Briefly, a first reactant solution of $AgNO_3$ and 18-crown-6 and a second reactant solution of NaBr and 18-crown-6 were prepared in each of the following solutions: DMSO, DMF, THF, quinoline, nitrobenzene, and pyridine. In each reaction, AgBr was produced as roughly spherical crystals of comparatively poorly defined habit, with no clearly identifiable facets. Hence, whereas this same reaction performed in an aqueous solvent produced an amorphous crystallite, these Examples produced roughly spherical crystals.

EXAMPLES 19–20

In these examples, reaction of $AgNO_3$ and NaBr to form AgBr by liquid-liquid interdiffusion of the respective reactant salt-containing solutions was examined. Only the reactant solution of NaBr contained a complexing agent.

Briefly, a first reactant solution of $AgNO_3$ and a second reactant solution of NaBr and 18-crown-6 were prepared in each of the following solutions: methanol, and ethanol. In each reaction, as in Examples 15–20, AgBr was produced as roughly spherical crystals of comparatively poorly defined habit, with no clearly identifiable facets.

EXAMPLES 21–22

In these examples, reaction of $AgNO_3$ and KBr to form AgBr by liquid-liquid interdiffusion of the respective reactant salt-containing solutions was examined. Only the reactant solution of KBr included a complexing agent.

Briefly, a first reactant solution of $AgNO_3$ and a second reactant solution of KBr and 18-crown-6 were prepared in each of the following solutions: methanol, and ethanol. In each reaction, as in Examples 15–20, AgBr was produced as roughly spherical crystals of comparatively poorly defined habit, with no clearly identifiable facets.

Thus, formation of silver halides having different crystal habit and/or morphology has been achieved in non-aqueous solvents, wherein the often powerful solvent effects on crystal habit and morphology are exhibited. Key variables include the apparatus used to execute the crystal-forming reaction, type of solvent, presence or absence of complexing agent, presence or absence of a gel, type of gel, and concentration of gel; each of these variables can exert a demonstrable and substantial influence on the habit and/or morphology of the crystals formed. These variables can be selectively manipulated to fine-tune the crystalline product so as to optimize the desired solid-state properties of the crystals.

Whereas the present invention has been described in connection with preferred embodiments and numerous examples, it will be understood that the invention is not limited to those embodiments or examples. On the contrary, the invention is intended to encompass all alternatives, modifications, and equivalents as may be included within the spirit and scope of the invention as defined by the appended claims.

What is claimed is:

1. A method for forming a silver halide crystallite, the method comprising:
   (a) adding a silver salt and a halide salt, at least one of the salts being substantially soluble in water, and a complexing agent to an essentially non-aqueous reaction solvent to form a reaction system, the silver salt and halide salt being reactive with each other in water to form a first crystallite of silver halide, the complexing agent being soluble in the reaction solvent and being selected from a group consisting of crown ethers, tris (methoxyethoxyethyl)amines, poly(ethylene glycols), and glymes, the complexing agent being capable of forming chelation complexes with at least one of the salts in the reaction solvent, the silver salt and halide salt being added to the reaction solvent for reaction with each other in the reaction system to form a silver halide;
   (b) allowing the silver salt and halide salt to react with each other in the reaction system to form a second crystallite precipitate, the second crystallite comprising crystals of silver halide that have a different habit or morphology from silver halide crystals in the first crystallite that would otherwise be formable in water by reaction of the silver salt and halide salt without the complexing agent.

2. The method of claim 1, wherein the reaction solvent is selected from a group consisting of polar aprotic solvents; alkanes, olefins, and alcohols, having up to 20 carbons; any of various mixtures of such solvents with each other; and any of various mixtures of such solvents with water.

3. The method of claim 2, wherein the polar aprotic solvent is selected from the group consisting of ethereal solvents having up to 20 carbons; alkyl halides and ketones having up to 20 carbons; aromatic, heteroaromatic, and aryl halide solvents having up to 20 carbons; and any of various mixtures of such solvents with each other.

4. The method of claim 2, wherein the reaction solvent is substantially non-polar.

5. The method of claim 1, wherein the reaction system further comprises a gel.

6. The method of claim 5, wherein the gel is selected from a group consisting of poly(vinylacetate), poly(vinylalcohol), poly(vinylchloride), poly(ethylene), and poly(styrene).

7. The method of claim 1, wherein the silver salt is selected from a group consisting of silver tetrafluoroborate, silver nitrate, silver chlorate, silver bromate, silver iodate, silver cyanate, silver sulfate, and silver salts of monobasic acids of the formula $RCO_2Ag$, wherein $RCO_2$ is acetate, propanoate, butyrate, valerate, lactate, benzoate, salicylate, cinnamate, laurate, linoleate, oleate, palmate, and stearate; and the halide salt is selected from a group consisting of compounds having the formula MX or $M'X_2$, wherein M is Li, Na, K, Rb, Cs, or $NH_4$; M' is Mg, Ca, Sr, or Ba; and X is F, Cl, Br, or I.

8. The method of claim 1, wherein the complexing agent is selected from a group consisting of 12-crown-4, 15-crown-5, 18-crown-6, dicyclohexyl-18-crown-6, and dibenzo-18-crown-6.

9. A method for forming a crystallite of silver halide, the method comprising:
   (a) providing a silver salt and a halide salt, at least one of said salts being substantially soluble in water, said salts reacting with each other in water to form a first crystallite of silver halide;
   (b) providing a complexing agent that is soluble in and can form chelation complexes with the silver salt in an organic solvent, the complexing agent being selected from a group consisting of crown ethers, tris (methoxyethoxyethyl)amines, poly (ethylene glycols), and glymes;
   (c) adding the silver salt and halide salt along with the complexing agent to the organic solvent in a reaction system, the silver salt and halide salt reacting with each other to form a silver halide in the reaction system; and
   (d) allowing the silver salt and halide salt to react with each other in the reaction system to form a second crystallite precipitate of the silver halide in the organic solvent, the second crystallite precipitate comprising crystals of the silver halide that have a different habit or morphology from crystals of the silver halide in the first crystallite that would otherwise be formable in water by reaction of the silver salt and halide salt without the complexing agent.

10. The method of claim 9, wherein the silver salt is poorly soluble to insoluble in the organic reaction solvent.

11. The method of claim 9, wherein the organic solvent is selected from a group consisting of polar aprotic solvents; alkanes, olefins, and alcohols, having up to 20 carbons; any of various mixtures of such solvents with each other; and any of various mixtures of such solvents with water.

12. The method of claim 11, wherein the polar aprotic solvent is selected from the group consisting of ethereal solvents having up to 20 carbons; alkyl halides and ketones having up to 20 carbons; aromatic, heteroaromatic, and aryl halide solvents having up to 20 carbons; and any of various mixtures of such solvents with each other.

13. The method of claim 11, wherein the reaction solvent is substantially non-polar.

14. The method of claim 9, wherein the reaction system further comprises a gel.

15. The method of claim 14, wherein the gel is selected from a group consisting of poly(vinylacetate), poly(vinylalcohol), poly(vinylchloride), poly(ethylene), and poly(styrene).

16. The method of claim 9, wherein the silver salt is selected from a group consisting of silver tetrafluoroborate, silver nitrate, silver chlorate, silver bromate, silver iodate, silver cyanate, silver sulfate, and silver salts of monobasic acids of the formula $RCO_2Ag$, wherein $RCO_2$ is acetate, propanoate, butyrate, valerate, lactate, benzoate, salicylate, cinnamate, laurate, linoleate, oleate, palmate, and stearate; and the halide salt is selected from a group consisting of compounds having the formula MX or $M'X_2$, wherein M is Li, Na, K, Rb, Cs, or $NH_4$; M' is Mg, Ca, Sr, or Ba; and X is F, Cl, Br, or I.

17. The method of claim 9, wherein the organic solvent is selected from a group consisting of dimethylsulfoxide, dimethylformamide, tetrahydrofuran, nitrobenzene, pyridine, and quinoline.

18. The method of claim 9, wherein the complexing agent is selected from a group consisting of 12-crown-4, 15-crown-5, 18-crown-6, dicyclohexyl-18-crown-6, and dibenzo-18-crown-6.

* * * * *